United States Patent [19]

Blakeney et al.

[11] Patent Number: 5,001,040
[45] Date of Patent: Mar. 19, 1991

[54] PROCESS OF FORMING RESIST IMAGE IN POSITIVE PHOTORESIST WITH THERMALLY STABLE PHENOLIC RESIN

[75] Inventors: Andrew J. Blakeney, Seekonk, Mass.; Thomas Sarubbi, Providence, R.I.; Joseph J. Sizensky, Seekonk, Mass.

[73] Assignee: Olin Hunt Specialty Products Inc., Cheshire, Conn.

[21] Appl. No.: 540,249

[22] Filed: Jun. 18, 1990

Related U.S. Application Data

[62] Division of Ser. No. 217,512, Jul. 11, 1988, Pat. No. 4,959,292.

[51] Int. Cl.$^5$ .......................... G03F 7/30; G03F 7/023
[52] U.S. Cl. .................................... 430/326; 430/165; 430/191; 430/192; 430/296; 430/323; 430/330
[58] Field of Search ............... 430/326, 302, 309, 192, 430/165, 296, 330, 323

[56] References Cited

U.S. PATENT DOCUMENTS

| | | | |
|---|---|---|---|
| 3,474,065 | 10/1969 | Gburek et al. | 260/38 |
| 3,624,162 | 11/1971 | Sieber | 260/619 B |
| 4,123,279 | 10/1978 | Kobayashi | 430/192 |
| 4,189,610 | 2/1980 | Coleman | 568/646 |
| 4,306,010 | 12/1981 | Uehara et al. | 430/190 |
| 4,342,852 | 8/1982 | Takada et al. | 525/481 |
| 4,345,054 | 8/1982 | Takeda et al. | 525/480 |
| 4,404,272 | 9/1983 | Stahlhofen | 430/192 |
| 4,477,553 | 10/1984 | Yamamoto et al. | 430/192 |
| 4,529,682 | 7/1985 | Toukhy | 430/165 |

FOREIGN PATENT DOCUMENTS

| | | | |
|---|---|---|---|
| 211667 | 2/1987 | European Pat. Off. | 430/192 |
| 224911 | 6/1987 | European Pat. Off. | |
| 273026 | 2/1988 | European Pat. Off. | 430/326 |
| 60-008023 | 6/1984 | Japan . | |
| 1051335 | 12/1966 | United Kingdom . | |

OTHER PUBLICATIONS

Pampalone, T. R., *Solid State Technology*, 6/1984, pp. 115–120.

Hiraoka, H., *ACS Symposium Series No. 266*, 1984 pp. 339–359.

English abstract of Japanese Pat. Pub. #85-008023, published 2/28/85, (Mitsui Petrochem. Ind. KK).

*Primary Examiner*—Charles L. Bowers, Jr.
*Attorney, Agent, or Firm*—William A. Simons

[57] ABSTRACT

A phenolic novolak resin comprising the product of a condensation reaction of an aldehyde comprising a haloacetaldehyde source or a mixture of a haloacetaldehyde source and a formaldehyde source with a phenolic monomer comprising at least one compound of the formula:

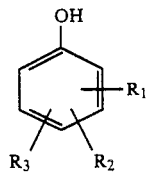

wherein $R_1$, $R_2$ and $R_3$ are individually selected from hydrogen or a one to four carbon alkyl group and wherein the ratio of total carbon atoms in the sum of $R_1$, $R_2$ and $R_3$ to the total number of phenolic nuclei in said resin is from about 0.5:1 to about 1.5:1 in the presence of a solvent; said resin made by employing a molar ratio of total aldehyde to total phenolic monomers from about 0.33:1 to about 0.70:1. These phenolic resins are suitable for use in light-sensitive compositions (e.g. positive-working photoresists).

3 Claims, No Drawings

PROCESS OF FORMING RESIST IMAGE IN POSITIVE PHOTORESIST WITH THERMALLY STABLE PHENOLIC RESIN

This application is a division of application Ser. No. 07/217,512, filed July 11, 1988, now U.S. Pat. No. 4,919,292.

BACKGROUND OF THE INVENTION

1. Field of the Invention

The present invention relates to selected phenolic resins made up of a condensation product of an aldehyde comprising either a haloacetaldehyde source or a mixture of a haloacetoaldehyde source and a formaldehyde source with selected phenolic monomers Furthermore, the present invention relates to light-sensitive compositions useful as positive-working photoresist compositions, particularly, those containing these phenolic resins and o-quinonediazide photosensitizers. Still further, the present invention also relates to substrates coated with these light-sensitive compositions as well as the process of coating, imaging and developing these light-sensitive mixtures on these substrates.

2. Description of Related Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards The coated substrate is then baked to evaporate any solvent in the photoresist composition and to fix the coating onto the substrate. The baked coated surface of the substrate is next subjected to an image-wise exposure of radiation This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions—negative-working and positive-working. Both negative-working and positive-working compositions are generally made up of a resin and a photoactive compound dissolved in a suitable casting solvent. Additives may be added for specific functions. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution, plasma gases or the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics. Preferred positive-working photoresists today generally involve novolak-related resins and o-quinonediazide photoactive compounds dissolved in a suitable solvent.

Photoresist resolution is defined as the smallest feature which the resist composition can be consistently transferred from the photomask to the substrate with a high degree of image edge acuity after exposure and development under conditions of reasonable manufacturing variation (such as variations in resist application, exposure energy, focus variation, development variation, and the like). In other words, resolution is the smallest feature which a photoresist user has the practical ability to produce clean images In many manufacturing applications today, resist resolution on the order of one micron or less are necessary.

In addition, it is generally desirable that the developed photoresist wall profiles be near vertical relative to the substrate. Such demarcations between developed and undeveloped areas of the resist coating translate into accurate pattern transfer of the mask image onto the substrate. Moreover, it is also desirable that the photoresists have high thermal flow stability, high alkaline solubility and little or no scumming in the spaces between the developed lines.

One drawback with positive-working photoresists known heretofore is their limited resistance to thermal image deformation during heat generating processes and to dry etching steps. This is becoming an increasing problem because modern processing techniques in semiconductor manufacture (e.g. plasma etching, ion bombardment) require photoresist images which have higher image deformation temperatures (e.g. 140° C.–200° C.). Addressing these problems, photoresist manufacturers have developed options such as higher molecular weight novolak resins, more thermal-etch-resistant polymer species and silicon-containing resins. Processing techniques, such as alternate postbake cycles and deep-UV hardening have been developed to enhance resist image thermal stability. Past efforts to increase thermal stability (e.g. increased molecular weight of the resin) generally caused significant decrease in other desirable properties (e.g. decreased photospeed, diminished adhesion, or reduced contrast, poorer developer dissolution rates, or combinations thereof).

Accordingly, there is a need for improved novolaks useful in positive-working photoresist formulations which are capable of producing images that are resistant to thermal deformation at temperatures of about 140° to 200° C. or higher while maintaining the other desired properties (e.g. alkaline developer dissolution rates, low scumming and good resolution) at suitable levels. The present invention is believed to be an answer to that need.

SUMMARY OF THE INVENTION

Accordingly, the present invention is directed to a phenolic novolak resin comprising the product of the condensation reaction of an aldehyde source comprising a haloacetaldehyde source or a mixture of haloacetaldehyde source and formaldehyde source with a phenolic monomer comprising at least one compound of the formula:

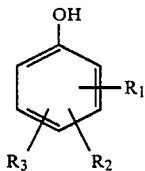

wherein $R_1$, $R_2$ and $R_3$ are individually selected from hydrogen or one to four carbon alkyl and wherein the ratio of total carbon atoms in the sum of $R_1$, $R_2$ and $R_3$ to the total number of phenolic nuclei in said resin is from about 0.5:1 to about 1.5:1 in the presence of an organic solvent; said resin made by employing a molar ratio of total aldehyde to total phenolic monomer from about 0.33:1 to about 0.70:1.

Moreover, the present invention is directed to a light-sensitive composition useful as a positive photoresist comprising an admixture of a light-sensitive o-quinonediazide compound and binder resin comprising at least one unit of the above condensation product; the amount of said o-quinonediazide compound or compounds being about 5% to about 40% by weight and the amount of said binder resin being about 60% to 95% by weight, based on the total nonvolatile solids content of said light-sensitive composition.

Still further, the present invention also encompasses the process of coating substrates with these light-sensitive compositions and then imaging and developing these coated substrates.

Also further, the present invention encompasses said coated substrates (both before and after imaging) as novel articles of manufacture.

DETAILED DESCRIPTION

These phenolic resin units above are preferably made by reacting a haloacetaldehyde source or a mixture of a haloacetaldehyde source and a formaldehyde source with the selected phenolic monomers as defined above. Preferred haloacetaldehyde sources include chloroacetaldehyde diethyl acetal (CDA), chloroacetaldehyde dimethyl acetal, aqueous chloroacetaldehyde and bromoacetaldehyde diethyl acetal and mixtures thereof. The most preferred haloacetaldehyde source is chloroacetaldehyde diethyl acetal because of relative operating safety and wide availability Preferred formaldehyde sources may include aqueous solutions of formaldehyde (formalin) or paraformaldehyde which is an oligomer of formaldehyde. Particularly, 37% by weight formalin which is commercially available in large quantities maybe suitably used. Suitable molar ratios of these two aldehyde sources may be from about 25:75 to about 100:0 when CDA and paraformaldehyde respectively are employed. One preferred phenolic monomer source is a mixture of meta-cresol and para-cresol having a molar percent ratio of meta-cresol to para-cresol which is from about 20:80 to about 100:0. More preferably, this molar percent feedstock ratio is from about 25:75 to about 40:60. Also, it may be preferred to add other phenolic monomers such as 3,5-xylenol, 2,5-xylenol, phenol or ortho-cresol or mixtures thereof to this mixture of meta- and para-cresols. A critical feature of the present invention is to have a total aldehyde to total phenolic ratio in the range of 0.33:1 to about 0.70:1, more preferably from about 0.35:1 to about 0.55:1. When this ratio is below about 0.33:1, the thermal resistance properties become inadequate. When this ratio is above about 0.7:1, the alkaline solubility is generally diminished especially when a low meta- to para-cresol feedstock ratio is employed.

Preferably, this reaction occurs in the presence of an acid catalyst Suitable acid catalysts include those commonly employed in acid condensation-type reactions such as HCl, $H_3PO_4$, $H_2SO_4$, oxalic acid, maleic acid, maleic anhydride and organic sulfonic acids (e.g. p-toluene sulfonic acid). The most preferred acid catalyst is oxalic acid. Generally, it is preferred to carry out this condensation reaction in the presence of an organic solvent alone or in admixture with water Suitable organic solvents include ethanol, tetrahydrofuran, dioxane, cellosolve acetate, 1-methoxy-2-propanol and 2-ethoxy ethanol Preferred solvents are water-soluble solvents such as ethanol, 1-methoxy-2-propanol, 2-ethoxy ethanol and dioxane by themselves or mixtures thereof with water.

In making the most preferred present classes of resins, the precursors, namely, the haloacetaldehyde source alone or with a formaldehyde source and the phenolic monomer source (e.g., a mixture of meta- and para-cresols alone) are preferably placed in a reaction vessel with the solvent. An acid catalyst as noted above is also preferably added to the reaction mixture The mixture is then preferably heated to a temperature in the range from about 80° C. to about 120° C., more preferably from about 90° C. to about 110° C., for the novolak-forming condensation polymerization reaction to occur. If an aqueous medium is used with an organic solvent, the reaction temperature is usually maintained at reflux, e.g. about 95° C. to 105° C. The reaction time will depend on the specific reactants used and the ratio of haloacetaldehyde to phenolics. Reaction times from about 6 to 20 hours are generally suitable.

The resins of the present invention preferably have a molecular weight of from about 1500 to about 7000, more preferably from about 2000 to about 6000.

The above-discussed resins of the present invention may be mixed with photoactive compounds to make light-sensitive mixtures which are useful as positive acting photoresists. The preferred class of photoactive compounds (sometimes called light sensitizers) is o-quinonediazide compounds particularly esters derived from polyhydric phenols, alkylpolyhydroxyphenones, aryl-polyhydroxyphenones, and the like which can contain up to six or more sites for esterification. The most preferred o-quinonediazide esters are derived from 2-diazo-1,2-dihydro-1-oxonaphthalene-4-sulfonic acid and 2-diazo-1,2-dihydro1-oxo-naphthalene-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,2',4,4'-tetrahydroxybenzophenone 1,2-naphthoquinonediazide-5-sulfonic acid esters, 2,3,4,4'-tetrahydroxy-benzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4',6'-pentahydroxybenzophenone 1,2-naphthoquinonediazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)methane 1,2-naphthoquinonediazide-4-sulfonic acid esters, bis(2,4-dihydroxyphenyl)methane 1,2-naphthoquinone-diazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters and 2,2-bis(2,3,4-trihydroxyphenyl)propane 1,2-naphthoquinonediazide-5sulfonic acid esters Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc (New York). In addition, these materials may be used in combinations of two or more. Further, mixtures of substances formed when less than all esterification sites present on a particular polyhydric phenol, alkylpolyhydroxyphenone, arylpolyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups, i.e. about 2 to 6 hydroxyl groups, are most preferred.

Among these most preferred 1,2-naphthoquinone5-diazide compounds are 2,3,4-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, and 2,3,3',4,4',5-hexahydroxybenzophenone 1,2-naphthoquinonediazide-5-sulfonic acid esters. These 1,2-quinonediazide compounds may be used alone or in combination of two or more.

The proportion of the light sensitizer compound in the light-sensitive mixture may preferably range from about 5 to about 40%, more preferably from about 10 to about 30% by weight of the non-volatile (e.g. non-solvent) content of the light-sensitive mixture The proportion of total binder resin of this present invention in the light-sensitive mixture may preferably range from about 60 to about 95%, more preferably, from about 70 to 90% of the non-volatile (e.g. excluding solvents) content of the light-sensitive mixture.

These light-sensitive mixtures may also contain conventional photoresist composition ingredients such as other resins, solvents, actinic and contrast dyes, antistriation agents, plasticizers, speed enhancers, and the like. These additional ingredients may be added to the binder resin and sensitizer solution before the solution is coated onto the substrate.

Other alkali soluble binder resins may also be added beside the resins of the present invention mentioned above. Examples include phenolic-formaldehyde resins, cresol-formaldehyde resins, phenol-cresolformaldehyde resins and polvinylphenol resins commonly used in the photoresist art. If other binder resins are present, they may replace a portion of the binder resins of the present invention Most preferably, the binder resins of the present invention comprise at least about 50% by weight of the resin component The total amount of the binder resin in the light-sensitive composition will be from about 60% to about 95% by weight of the total nonvolatile solids (i.e. nonsolvent) content of the light-sensitive composition.

The resins and sensitizers may be dissolved in a casting solvent or solvents to facilitate their application to the substrate. Examples of suitable casting solvents include methoxyacetoxy propane, ethyl cellosolve acetate (ethyl 3-ethoxy propionate), n-butyl acetate, xylene, ethyl lactate, propylene glycol alkyl ether acetates, cyclopentanone, n-hexanol, bis(2-methoxyethyl) ether [Diglyme] or mixtures thereof and the like. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g. 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)]. The amount of actinic dyes may be up to ten percent weight levels, based on the combined weight of resin and sensitizer.

Contrast dyes enhance the visibility of the developed images and facilitate pattern alignment during manufacturing. Examples of contrast dye additives that may be used together with the light-sensitive mixtures of the present invention include Solvent Red 24 (C.I No. 26105), Basic Fuchsin (C.I. 42514), Oil Blue N (C.I. No.

61555) and Calco Red A (C.I. No. 26125) up to ten percent weight levels, based on the combined weight of resin and sensitizer Anti-striation agents level out the photoresist coating or film to a uniform thickness. Anti-striation agents may be used up to five percent weight levels, based on the combined weight of resin and sensitizer. One suitable class of anti-striation agents is non-ionic silicon-modified polymers. Non-ionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(B-chloroethyl)-ester; stearic acid; dicamphor; polypropylene; acetal resins; phenoxy resins; and alkyl resins up to ten percent weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e. in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20 percent, based on the combined weight of resin and sensitizer.

The prepared light-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components An aluminum/aluminum oxide wafer can be used as well The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Conventional development techniques such as immersion development, spray development or puddle development, or combinations thereof, may be used for this step.

The substrates are allowed to remain in the developer until all of the resist coating has dissolved from the exposed areas Normally, development times from about 10 seconds to about 3 minutes are employed After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature In industrial applications, particularly in the manufacture of microcircuitry units on silicon/silicon dioxide-type substrates, the developed substrates may then be treated with a buffered, hydrofluoric acid etching solution or plasma gas etch The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations The present invention is further described in detail by means of the following Experiments All parts and percentages are by weight unless explicitly stated otherwise.

EXPERIMENTS 1-25

NOVOLAK SYNTHESIS

The following is a general procedure which can be applied to the synthesis of all the specific novolaks listed in Table 1.

To a 500 mL three-neck round bottom flask was added the meta- and para-cresol mixture (80 00 g, 740 mmoles), 1-methoxy-2-propanol (128.00 g), water (43.2 g), chloroacetaldehyde diethyl acetal (CDA) [The mmoles of CDA needed was determined for each experiment by multiplying the mmoles of cresols (740 mmoles) times the aldehyde to cresol ratio listed in Table 1], and oxalic acid dihydrate (2.8 g). The mixture was refluxed at 97°–100° C. for 20 hours. The resulting dark brown solution was allowed to cool and was diluted with 100 weight percent 1-methoxy-2-propanol based on the total reaction solution The resulting solution was then added dropwise to a ten-fold weight excess of stirred water (approximately 6200 to 6400 g) at 50° C.

For each reaction, the polymer precipitated as a light brown solid. It was isolated by either filtering off the precipitate or, if the precipitate was not finely divided and conglomerates together, the mother liquor was decanted Then, the precipitate was reslurried in water during which the precipitate became finely divided and was easily filtered The precipitate was then washed with deionized water (4 times). Conglomeration occurred during the precipitation of the novolaks prepared with relatively low aldehyde to cresol ratios. The wet precipitate was dried to constant weight either in a vacuum oven between 40°–45° C. or in air at ambient temperature, resulting in a fine light brown powder (typically between about 40 to about 70 grams).

Elemental analysis on selected product samples found that only 1.6 to 1.8% by weight of those novolak products was composed of chlorine. If all of the chlorine was incorporated into these novolaks, the theoretical percentage of chlorine would be about 21% by weight of each novolak. This substantial deficiency of chlorine was surprising and a clear understanding of the actual structure of the novolak is not known.

Gas chromatographic analysis of a majority of the prepared novolaks 1–25 found that the resulting products contained 2.5 to 10.6% by weight cresol monomers, especially p-cresol monomer Surprisingly, it was found that these novolaks also have such high thermal flow stability. p-Cresol is a good plasticizer and its presence would only diminish thermal flow resistance. This suggests that these novolaks may inherently have even more thermal flow stability which would be exhibited if the residual monomer were removed.

Molecular weights of these novolaks were determined by gel permeation chromatography using the following apparatus, method and conditions.

| | |
|---|---|
| Column Set | 500-100-40-$10^4$ Å ASI Ultragels (Styrene-divinylbenzene) |
| Column Oven Temp. | 35° C. |
| Solvent | Tetrahydrofuran |
| Flow Rate | 1.0 mL/min. |
| Detector | Waters Model 410 Differential Refractive Index |
| Detector Temp. | 35° C. |
| Injector | Waters Model 712 Intelligent Sample Processor |
| Injection Volume | 300 microliters |
| Calibration | Narrow molecular weight distribution polystyrene standards |
| Data Handling | Waters Model 840 Data Station with Waters LC/GPC Multi-System Data Reduction with Control Expert Chromatography Software: Version 6.0 |
| Internal Reference | Toluene was used as an internal reference for normalization of retention times |
| Sample Preparation | 25-30 mg samples of novolak were totally dissolved in 10 mL of tetrahydrofuran. The resulting solutions were filtered through 0.2μ filters. |

The novolaks listed in Table 1 show that a broad range of meta- to para-cresols molar percent feedstock ratios (25/75 to 100/0) in conjunction with aldehyde to total cresol molar feedstock ratios between 0.375:1 to 0.65:1 can be used to prepare novolaks which exhibit excellent thermal flow resistance yet retain the rates of alkaline solubility needed for photoresist applications.

TABLE 1

META- AND PARA-CRESOL CHLOROACETALDEHYDE NOVOLAKS
Experiments 1–25

| EXPERIMENT | FEEDSTOCK M/P$^{(a)}$ | FEEDSTOCK ALD/C$^{(b)}$ | $T_c^{(c)}$ (sec/μ) | $M_w^{(d)}$ | HEAT RESISTANCE AT 150° C.$^{(e)}$ | YIELD$^{(f)}$ (g) |
|---|---|---|---|---|---|---|
| 1 | 100/0 | 0.65 | 40 | 14928 | > | 100.1 |
| 2 | 70/30 | 0.45 | 12 | 3681 | > | 71.1 |
| 3 | 70/30 | 0.50 | 32 | 5612 | > | 76.5 |
| 4 | 60/40 | 0.40 | 9 | 2603 | > | 57.4 |
| 5 | 60/40 | 0.45 | 23 | 4307 | > | 67.7 |
| 6 | 60/40 | 0.50 | 40 | 6091 | > | 71.0 |
| 7 | 50/50 | 0.35 | 4 | 2477 | > | 57.8 |
| 8 | 50/50 | 0.40 | 17 | 2307 | > | 60.9 |
| 9 | 50/50 | 0.45 | 62 | 4882 | > | 65.2 |
| 10 | 50/50 | 0.475 | 119 | 6694 | > | 67.5 |
| 11 | 40/60 | 0.35 | 11 | 2603 | > | 53.5 |
| 12 | 40/60 | 0.40 | 19 | 3042 | > | 67.5 |
| 13 | 40/60 | 0.425 | 180 | 4289 | > | 61.9 |
| 14 | 40/60 | 0.45 | 310 | 5184 | > | 63.6 |
| 15 | 40/60 | 0.475 | 865 | 6361 | > | 66.1 |
| 16 | 40/60 | 0.50 | >815 | 6040 | > | 59.0 |
| 17 | 40/60 | 0.55 | >9999 | 8989 | > | 63.2 |
| 18 | 35/65 | 0.40 | 103 | 3458 | > | 59.6 |
| 19 | 35/65 | 0.412 | 219 | 3759 | > | 60.4 |
| 20 | 35/65 | 0.425 | 237 | 4083 | > | 61.1 |
| 21 | 30/70 | 0.30 | 4 | 1205 | > | 40.4 |
| 22 | 30/70 | 0.35 | 40 | 2714 | = | 53.3 |
| 23 | 30/70 | 0.375 | 90 | 2646 | = | 55.3 |
| 24 | 30/70 | 0.40 | 179 | 2927 | > | 57.5 |

TABLE 1-continued

META- AND PARA-CRESOL CHLOROACETALDEHYDE NOVOLAKS
Experiments 1-25

| EXPERIMENT | FEEDSTOCK M/P[a] | ALD/C[b] | $T_c$[c] (sec/μ) | $M_w$[d] | HEAT RESISTANCE AT 150° C.[e] | YIELD[f] (g) |
|---|---|---|---|---|---|---|
| 25 | 25/75 | 0.375 | 120 | 2307 | = | 54.8 |

[a]M/P = The molar percentage ratio of meta-cresol to para-cresol in the feedstock.
[b]ALD/C = The molar ratio of chloroacetaldehyde source to cresol in the feedstock.
[c]$T_c$ = The time, in seconds, required to dissolve a one micron coating of novolak immersed in a 0.263 N aqueous tetramethylammonium hydroxide solution using a Perkin-Elmer development rate monitor.
[d]$M_w$ = The weight average molecular weight relative to polystyrene standards as determined by gel permeation chromatography.
[e]HEAT RESISTANCE = The resistance or lack of resistance of the novolak coating to bulk flow or coating deformation (e.g. rounding) at 150° C. Novolak coatings were spun coated on Si/SiO$_2$ wafers and were baked at 100° C. for thirty minutes in a convection oven to give approximately one micron coatings of novolak. The coatings were scratched and the wafers were then subjected to a 150° C. bake for thirty minutes in a convection oven. The coat ings were scrutinized microscopically for signs of flow or rounding, especially at the sidewalls of the scratch ([>] = >150° C., [=] = 150° C. [<] = <150° C.).
[f]= All yields are reported as grams of novolak isolated from the polymerization of 740 mmoles of phenolic monomers (80.00 g of cresols).

EXPERIMENTS 26-27

Two novolaks were prepared in exactly the same fashion as Experiments 1-25. However, 3,5-xylenol was used as a third monomer in the feedstock in addition to the m-cresol and p-cresol The molar percentage ratios of the three monomers (the total moles of these phenolics is 740 mmoles) and the aldehyde to cresol molar ratio for each feedstock are listed in Table 2 below. After the 20 hour reflux the solutions are a golden-brown and the resulting precipitates are a light yellow-tan. The yields are reported in Table 2, below.

When compared to a similar m/p-chloroacetaldehyde novolak (Experiment 9), the incorporation of 3,5-xylenol resulted in a novolak with somewhat lower alkaline solubility, lower weight average molecular weight and somewhat higher yields The thermal flow resistance of these novolaks remained excellent.

TABLE 2

META- AND PARA-CRESOL AND
3,5-XYLENOL/CHLOROACETALDEHYDE NOVOLAKS

| EXPERIMENT | M/P/3,5-XYL[a] | ALD/C | $T_c$ (sec/μ) | 150° C. HEAT RESISTANCE | $M_w$ | YIELD (g) |
|---|---|---|---|---|---|---|
| 26 | 50/25/25 | 0.45 | 321 | > | 2819 | 75.9 |
| 27 | 25/50/25 | 0.45 | 165 | > | 3089 | 67.6 |

[a]M/P/3,5-XYL = The molar percent ratio of meta-cresol to para-cresol to 3,5-xylenol in the feedstock.

EXPERIMENT 28

A novolak (see Table 3 for characteristics) was prepared analogously to Experiment 25 but without addition of water to the feedstock A typical light tan powder was isolated (59.5 g).

Apparently, the water played a significant role in the polymerization step. Comparison of Experiments 25 and 28 shows that Experiment 26 gives a novolak which exhibits a higher yield, lower weight average molecular weight, lower heat/flow resistance and alkaline solubility.

EXPERIMENTS 29-34

Six novolaks were prepared similar to Experiments 1-25, except (1) the water and 1-methoxy-2-propanol levels were varied in the polymerization feedstock and (2) after the polymerization, the novolaks were isolated by a two-step consecutive process of high temperature atmospheric and vacuum distillation (not precipitation as in Experiments 1-25).

The following is a synthetic procedure for Experiments 29, 33 and 34.

To a 500 mL three-neck round bottom flask was added the meta- and para-cresol mixture (80.00g, 740 mmoles), 1-methoxy-2-propanol (128.00g), water (43.20g), chloroacetaldehyde diethyl acetal (CDA) [The mmoles of CDA needed was calculated by multiplying the mmoles of cresols (740) times the aldehyde to cresol molar ratio], and oxalic acid dihydrate (2.80 g). The mixture was refluxed at 97°-100° C. for 20 hours. The resulting coffee black solution was atmospherically distilled from 100°to 200° C. for a period of 1 hour thus removing the water and solvent. The resulting viscous liquid was then vacuum distilled (to 3 mm Hg) for a period of 2 hours from 200°to 230° C. This removed the residual monomer and destroyed any residual oxalic acid catalyst. The novolak was cooled and a "coffee black" glassy solid is obtained The yields are reported in Table 3.

Experiment 29 shows that the high temperature isolation results in lower thermal flow resistance, moderately lower alkaline solubility and similar molecular weight to the analogous novolak isolated by precipitation (Compare Experiment 25 with 29).

Experiments 33 and 34 teach that high thermal flow resistance with still acceptable alkaline solubility can be obtained, even after the high temperature isolation procedure, by moderately increasing the m-cresol content in the polymerization feedstock (Compare Experiments 25, 29, 33 and 34).

EXPERIMENT 30

No Water, No Solvent

To a 500 mL three-neck round bottom flask was added the meta- and para-cresol mixture (25/75 m/p molar percent ratio) (160.00g, 1480 mmoles), chloroacetaldehyde diethyl acetal (CDA) (84 72 g) and oxalic acid dihydrate (5.60 g). The mixture was refluxed at 97°-100° C. for 20 hours The resulting dark solution was worked-up as above (See Experiments 29, 33 and 34). A cranberry-orange glassy novolak resulted (132.4 g).

EXPERIMENT 31

No Solvent

To a 500 mL three-neck round bottom flask was added the meta- and para-cresol (25/75 m/p molar percent ratio) (160.00g, 1480 mmoles), water (86.40g), chloroacetaldehyde diethyl acetal (CDA) (84.72 g) and oxalic acid dihydrate (5.60 g). The mixture was refluxed at 97°-100° C. for 20 hours The resulting dark solution was worked-up as above (See Experiments 29, 33 and 34). A cranberry colored glassy novolak results (119.8 g).

Experiment 32

No Water, Low Solvent

To a 500 mL three-neck round bottom flask was added the meta- and para-cresol mixture (25/75 m/p molar percent ratio) (160.00g, 1480 mmoles), 1-methoxy-2-propanol (50.00 g), chloroacetaldehyde diethyl acetal (CDA) (84.72 g) and oxalic acid dihydrate (5.60 g). The mixture was refluxed at 97°-100° C. for 20 hours. The resulting dark solution was worked-up as above (See Experiments 29, 33 and 34). A cranberry-orange colored glassy novolak resulted (129.8 g).

Experiments 30, 31 and 32 show that the levels of water and solvent (1-methoxy-2-propanol) in the polymerization feedstock are significant variables in obtaining the desired polymer properties. Lower levels of water and/or solvent result in relatively high yields of novolaks with relatively low molecular weights. These novolaks exhibit poor thermal flow resistance as evidenced by the softening points and 150°C. heat resistance listed in Table 3. The alkaline solubility of the novolaks is very high. (Compare Experiments 29-34.)

tively, except bromoacetaldehyde diethyl acetal was used as the aldehyde source.

These novolaks are very similar to their chloroacetaldehyde counterpart. The novolaks from bromoacetaldehyde exhibit slightly lower molecular weight, heat/flow resistance and yield Experiments 35 and 36 teach that bromoacetaldehyde diethyl acetal can also be used to prepare novolaks with the desired properties of those in Table 1.

TABLE 4
META- AND PARA-CRESOL/BROMOACETALDEHYDE NOVOLAKS

| EXPERIMENT | M/P | ALD/C | $T_c$ sec/μ | 150° C. HEAT RESIST. | $M_w$ | YIELD (g) | ALDEHYDE SOURCE |
|---|---|---|---|---|---|---|---|
| 25 | 25/75 | 0.375 | 120 | > | 2307 | 54.8 | Chloroacetaldehyde Diethyl Acetal |
| 35 | 25/75 | 0.375 | 140 | = | 1971 | 48.2 | Bromoacetaldehyde Diethyl Acetal |
| 24 | 30/70 | 0.40 | 179 | > | 2927 | 57.5 | Chloroacetaldehyde Diethyl Acetal |
| 36 | 30/70 | 0.40 | 216 | > | 2260 | 48.0 | Bromoacetaldehyde Diethyl Acetal |

Experiments 37-40

Experiment 37

A novolak was prepared in an analogous fashion to that in Experiment 6, except paraformaldehyde was used as the aldehyde source instead of chloroacetaldehyde diethyl acetal.

Experiment 38

A novolak was prepared in an analogous fashion to that in Experiment 6, except the aldehyde source was composed of a mixture of 50 mole percent paraformaldehyde and 50 mole percent chloroacetaldehyde diethyl acetal.

Experiments 39 and 40

Two novolaks were prepared in an analogous fashion to Experiment 38, except the novolaks employed a 30/70 meta- and para-cresol molar percent ratio in the feedstock and aldehyde aldehyde/cresol molar ratios were 0.50 and 0.55, respectively.

Experiment 37 teaches that the replacement of chloroacetaldehyde diethyl acetal with paraformaldehyde results in low molecular weight novolak which exhibits detrimentally slow alkaline solubility and poor thermal

TABLE 3
EFFECTS OF SOLVENT LEVELS AND WORK-UP PROCEDURES

| EXPERIMENT | M/P | ALD/C | WT %[a] $H_2O$ | WT %[b] PM | SOFT.[c] POINT (°C.) | $T_c$ sec/μ | 150° C. HEAT RESISTANCE | YIELD[d] (g) | $M_w$ | ISOLATION PROCEDURE |
|---|---|---|---|---|---|---|---|---|---|---|
| 25 | 25/75 | 0.375 | 54 | 160 | N.M. | 120 | = | 54.8 | 2307 | PPTN[e] |
| 28 | 25/75 | 0.375 | 0 | 160 | N.M. | 29 | < | 59.0 | 1696 | PPTN |
| 29 | 25/75 | 0.375 | 54 | 160 | 156 | 207 | < | 49.6 | 2786 | H.T.[f] |
| 30 | 25/75 | 0.375 | 0 | 0 | 143 | 4 | < | 61.2 | 1607 | H.T. |
| 31 | 25/75 | 0.375 | 54 | 0 | 149 | 24 | < | 59.9 | 2267 | H.T. |
| 32 | 25/75 | 0.375 | 0 | 31 | 143 | 5 | < | 64.9 | 1775 | H.T. |
| 33 | 35/65 | 0.40 | 54 | 160 | 154 | 521 | > | 52.4 | 4244 | H.T. |
| 34 | 40/60 | 0.40 | 54 | 160 | 163 | 209 | > | 51.7 | 4284 | H.T. |

[a]WT % $H_2O$ = The weight percent of water charged before the polymerization relative to the total cresol weight charged.
[b]WT % PM = The weight percent of 1-methoxy-2-propanol (PM) solvent charged relative to the total cresol weight charged.
[c]Soft. Point (°C.) = The softening point temperature of the novolak as determined by the standard ball and ring method. N.M. means not measurable.
[d]Yield = All yields are reported as grams of novolak isolated from the polymerization of 740 mmoles of phenolic monomers (80.00 g of cresols).
[e]PPTN = Precipitation isolation procedure as described.
[f]H.T. = High temperature isolation procedure as described.

Experiments 35 and 36

Two novolaks were prepared in an analagous fashion to those prepared in Experiments 25 and 24 respecflow stability (compare Experiments 37 and 6).

Experiments 38-40 teach that a mixture of chloroacetaldehyde diethyl acetal and paraformaldehyde can be used to obtain novolaks with high thermal flow resistance and appropriate alkaline solubility (compare Experiments 38 and 6).

TABLE 5

META- AND PARA CRESOL/ 50/50 MIXTURE OF PARAFORMALDEHYDE AND CHLOROACETALDEHYDE DIETHYL ACETAL NOVOLAKS

| EXPERIMENT | M/P | ALD-/C[a] | $T_c$ sec/μ | 150° C. HEAT RESIST. | $M_w$ | YIELD[b] (g) | PARAFORM./CDA[c] MOLAR RATIO |
|---|---|---|---|---|---|---|---|
| 37 | 60/40 | 0.50 | 1444 | < | 1285 | 54.0 | 100/0 |
| 38 | 60/40 | 0.50 | 14 | > | 3304 | 63.4 | 50/50 |
| 6  | 60/40 | 0.50 | 40 | > | 2603 | 61.2 | 0/100 |
| 39 | 30/70 | 0.50 | 135 | = | 3610 | 56.2 | 50/50 |
| 40 | 30/70 | 0.55 | 316 | = | 3872 | 60.6 | 50/50 |

[a]ALD/C = The ratio of total moles of aldehyde source (either paraformaldehyde or CDA or both) to total moles of cresols in the feedstock.
[b]Yield = All yields are reported as grams of novolak isolated from the polymerization of 740 mmoles of phenolic monomers (80.00 g of cresols).
[c]Paraform./CDA Molar Ratio = The molar percent ratio of paraformaldehyde to CDA in the feedstock.

EXPERIMENTS 41-45

Experiment 41

The novolak was prepared in an analogous fashion to that from Experiment 10, except dioxane was used as the solvent instead of 1-methoxy-2- propanol.

Experiment 42

The novolak was prepared in an analogous fashion to that from Experiment 10, except aqueous chloroacetaldehyde was used as the aldehyde source instead of chloroacetaldehyde diethyl acetal that from using 1-methoxy-2-propanol (compare Experiments 41 and 10).

Experiments 42 and 43 teach that other sources of chloroacetaldehyde such as chloroacetaldehyde dimethyl acetal and aqueous chloroacetaldehyde, respectively, can be used to prepare novolaks similar in properties to that from using chloroacetaldehyde diethyl acetal (compare Experiments 42, 43 and 10).

Experiments 44 and 45 teach that acetal and acetaldehyde, respectively, are not reactive under these polymerization conditions and do not yield any novolak polymer.

TABLE 6

NOVOLAKS FROM VARIOUS ALDEHYDE SOURCES AND ALTERNATIVE SOLVENTS

| EXPERIMENT | M/P | ALD-/C[a] | $T_c$ sec/μ | 150° C. HEAT RESIST. | $M_w$ | YIELD[b] (g) | ALDEHYDE SOURCE | SOLVENT |
|---|---|---|---|---|---|---|---|---|
| 10 | 50/50 | 0.475 | 119 | > | 6694 | 67.5 | Chloroacetaldehyde Diethyl Acetal | PM |
| 41 | 50/50 | 0.475 | 72  | > | 4628 | 71.0 | Chloroacetaldehyde Diethyl Acetal | Dioxane |
| 42 | 50/50 | 0.475 | 40  | > | 3628 | 76.1 | Chloroacetaldehyde (Aqueous) | PM |
| 43 | 50/50 | 0.475 | 291 | > | 8466 | 69.2 | Chloroacetaldehyde Dimethyl Acetal | PM |
| 44 | 50/50 | 0.475 | (No Reaction, No Precipitate) | | | | Acetal | PM |
| 45 | 50/50 | 0.475 | (No Reaction, No Precipitate) | | | | Acetaldehyde | PM |

[a]ALD/C = The ratio of the indicated aldehyde source to cresol in the feedstock.
[b]Yield = All yields are reported as grams of novolak isolated from the polymerization of 740 mmoles of phenolic monomers (80.00 g of cresols).

Experiment 43

The novolak was prepared in an analogous fashion to that from Experiment 10, except chloroacetaldehyde dimethyl acetal was used as the aldehyde source instead of chloroacetaldehyde diethyl acetal.

Experiment 44

The preparation of a novolak was attempted in an analogous fashion to that from Experiment 10, except acetal was used as the aldehyde source instead of chloroacetaldehyde diethyl acetal No polymer was formed under these conditions.

Experiment 45

The preparation of a novolak was attempted in an analogous fashion to that from Experiment 10, except acetaldehyde was used as the aldehyde source instead of chloroacetaldehyde diethyl acetal No polymer was formed under these conditions Experiment 41 teaches that other solvents may be used to achieve a novolak with the outstanding properties of the claimed novolaks This Experiment uses dioxane as the solvent and shows that a non-alcoholic solvent gives a novolak which is similar in properties to

PHOTORESIST FORMULATION AND LITHOGRAPHIC EVALUATION

The following is a general photoresist formulation and lithographic evaluation procedure which was used for the novolaks listed in Table 7.

A photoresist was formulated by preparing a solution which contains a novolak (20.35 weight percent), the condensation product of 2.75 equivalents of 1,2-naphthoquinone-2-diazide-5-sulfonyl chloride with one equivalent of 2,3,4,4'-tetrahydroxybenzophenone (7.15 weight percent), a surfactant (0.06 weight percent) and ethylene glycol monomethylether acetate (72.44 weight percent). The solution was microfiltered to 0.2 microns and was spun cast upon Si wafers having a $SiO_2$ layer.

For the evaluations listed in Table 7, the $SiO_2$ layer was 2500 Å thick The coating was subjected to a hot-plate bake for 90 seconds at 100° C. and was exposed through a Nikon resolution reticle on a Nikon 5:1 projection stepper which was equipped with a 0.30 numerical aperture lens For the evaluations listed in Table 8, the $SiO_2$ layer was 6000 Å thick. The coating was subjected to a hot-plate bake for 60 seconds at 100° C. and was exposed through a GCA resolution reticle on a GCA 5:1 projection stepper which was equipped with a 0.30 numerical aperture lens.

For all photolithographic evaluations, a 60 second puddle development in an aqueous tetramethylammonium hydroxide solution (0.263 N) was employed which resulted in resist images whose characteristics are tabulated in Tables 7 and 8.

The first eight entries in Table 7 show the photolithographic performance of resists formulated with selected novolaks from Table 1. The evaluations show that these photoresists exhibit high resolution, nearly vertical profile, high image thermal flow stability, and scum-free images The resolution and profile appear to improve with a decrease in the meta- to para-cresol molar percent feedstock ratios The thermal flow stability increases with higher meta- to para-cresol molar percent feedstock ratios.

photoresists shown in Table 7 which were made from novolaks prepared by a low temperature precipitation technique.

Lithographic evaluations of photoresists which contain novolaks which were prepared from meta- and para-cresol and a 50/50 molar mixture of paraformaldehyde and chloroacetaldehyde (see Table 5), are itemized in Table 8.

The data in Table 8 shows that such novolaks can be used in photoresist formulations which exhibit very good overall performance in critical aspects (i.e. high resolution, very nearly vertical profiles, lack of scum, moderate photospeed ($E_{opt.}$) and high thermal flow resistance). When compared to a commercial positive photoresist (HPR-204), these resists show better performance in every category except the photospeed under these particular processing conditions.

TABLE 7

| | | LITHOGRAPHIC EVALUATION OF META- AND PARA-CRESOL/CHLOROACETALDEHYDE NOVOLAKS | | | | | | | |
|---|---|---|---|---|---|---|---|---|---|
| NOVOLAK EXPERIMENT | M/P[a] | ALD/C[b] | $E_{opt}$[c] mJ/cm$^2$ | L/S[d] ($\mu$) | C.H.[e] ($\mu$) | PROFILE[f] | SCUM[g] L/S | SCUM[g] C.H. | HEAT RESISTANCE[h] (°C.) |
| 6 | 60/40 | 0.50 | 100 | 0.8–0.9 | 1.1 | 4 | 7 | 4 | 200 |
| 9 | 50/50 | 0.45 | 84 | 0.8–0.9 | 1.1 | 4 | 7 | 4 | 190 |
| 10 | 50/50 | 0.475 | 128 | 0.8–0.9 | 1.2 | 5 | 7 | 4 | 200 |
| 12 | 40/60 | 0.40 | 84 | 0.8–0.9 | 1.0 | 4 | 7 | 4 | 185 |
| 22 | 30/70 | 0.35 | 85 | 0.8 | 1.0 | 4 | 7 | 4 | 145 |
| 23 | 30/70 | 0.375 | 147 | 0.7–0.8 | 0.9 | 6 | 7 | 4 | 145–150 |
| 24 | 30/70 | 0.40 | 226 | 0.7 | 0.9 | 7 | 7 | 4 | 155–160 |
| 27 | 25/75 | 0.375 | 248 | 0.7 | 0.9 | 7 | 7 | 6 | 140 |
| 33 | 35/65 | 0.40 | 373 | 0.7–0.8 | 0.85 | 7 | 6 | 7 | 150 |
| 34 | 40/60 | 0.40 | 153 | 0.8–0.0 | 1.1 | 7 | 6 | 7 | 155–160 |

[a]M/P = The molar ratio of meta-cresol to para-cresol in the feedstock.
[b]ALD/C = The molar ratio of chloroacetaldehyde or mixture of paraformaldehyde and chloroacetaldehyde diethyl acetal to cresols in the feedstock.
[c]$E_{opt}$ = The photospeed of the photoresist. It is defined as the energy of exposure required in mJ/cm$^2$ to reproduce line/space parity for 1.0 micron line/space geometries.
[d]RESOLUTION L/S = The smallest line/space feature size that is resolved at $E_{opt}$.
[e]RESOLUTION C.H. = The smallest contact hole that is resolved at $E_{opt}$ and exhibits no undeveloped residue in the exposed areas.
[f]PROFILE = The slope of the sidewalls of the resist lines. Vertical sidewalls are preferred. Scale is from 1 to 7 with 7 = best, 4 = good and 1 = fair.
[g]SCUM = The presence of residue between resolved resist features in exposed areas. Scale is from 1 to 7 with 7 = none, 4 = moderate and 1 = severe.
[h]HEAT RESISTANCE = The temperature at which the onset of bulk resist image deformation is observed. The wafers which carry the resist images are baked on a hot plate at a specific temperature for 4.0 minutes and the image is inspected for evidence of bulk flow with a scanning electron microscope.

Also as shown in Table 7, photoresists made from the high temperature insolation Experiments 33 and 34 have the same advantageous performance as the other

TABLE 8

| | | LITHOGRAPHIC EVALUATION OF META- AND PARA-CRESOL MIXTURE 50/50 MIXTURE OF PARAFORMALDEHYDE AND CHLOROACETALDEHYDE | | | | | | |
|---|---|---|---|---|---|---|---|---|
| NOVOLAK EXPERIMENT | M/P[a] | ALD/C[b] | $E_{opt}$[c] mJ/cm$^2$ | L/S[d] ($\mu$) | C.H.[e] ($\mu$) | PROFILE[f] | SCUM[g] L/S | HEAT RESISTANCE[h] (°C.) |
| 39 | 60/40 | 0.50 | 138 | 0.7–0.8 | <1.0 | 6 | 7 | 135 |
| 40 | 60/40 | 0.50 | 237 | 0.7–0.8 | <1.0 | 6 | 7 | 135 |
| HPR-204[i] | — | — | 116 | 0.8–0.9 | 1.4 | 4 | 2 | 120 |

[a]M/P = The molar ratio of meta-cresol to para-cresol in the feedstock.
[b]ALD/C = The molar ratio of chloroacetaldehyde or mixture of paraformaldehyde and chloroacetaldehyde diethyl acetal to cresols in the feedstock.
[c]$E_{opt}$ = The photospeed of the photoresist. It is defined as the energy of exposure required in mJ/cm$^2$ to reproduce line/space parity for 1.0 micron line/space geometries.
[d]RESOLUTION L/S = The smallest line/space feature size that is resolved at $E_{opt}$.
[e]RESOLUTION C.H. = The smallest contact hole that is resolved at $E_{opt}$ and exhibits no undeveloped residue in the exposed areas.
[f]PROFILE = The slope of the sidewalls of the resist lines. Vertical sidewalls are preferred. Scale is from 1 to 7 with 7 = best, 4 = good and 1 = fair.
[g]SCUM = The presence of residue between resolved resist features in exposed areas. Scale is from 1 to 7 with 7 = none, 4 = moderate and 1 = severe.
[h]HEAT RESISTANCE = The temperature at which the onset of bulk resist image deformation is observed. The wafers which carry the resist images are baked on a hot plate at a specific temperature for 4.0 minutes and the image is inspected for evidence of bulk flow with a scanning electron microscope.
[i]HPR-20 = Is a commercial positive photoresist sold by Olin Hunt Specialty Products, Inc. of West Paterson, New Jersey.

Plasma Etch Resistance

The plasma etch resistance of two meta-, para-cresol/chloroacetaldehyde novolaks was determined under aluminum etching conditions A sample of novolak from Experiment 24 and novolak sample composed of a 50:50 weight percent mixture of novolaks from Experiments 9 and 10 were formulated into photoresists as described above The resists were processed on Si/-SiO$_2$ wafers which were coated with a 1.0 u of aluminum. Resist images were developed to the aluminum surface.

The resist images were subjected to aluminum etching conditions during which the exposed aluminum substrate was etched The plasma etching study was conducted in a Plasmatherm single wafer etcher using a gas mixture of BCl$_{13}$, Cl$_2$, CH$_4$ and N$_2$. Radio frequency power used ranged from 180 to 240 W.

The novolaks exhibited excellent resistance to the harsh plasma environment. Bulk flow and reticulation of the resist images was not observed even under conditions which used highest radio frequency power. Furthermore, the etch rate selectivity (the ratio of the etch rate of aluminum to the etch rate of the photoresist) remained high at about 2.5:1.0. The superior thermal flow resistance of the photoresist is a major contributing factor to the excellent plasma etch resistance.

These results show that photoresists prepared from novolaks of this invention are much superior to conventional positive photoresists such as HPR-204 which show flow and reticulation of images at much milder etching conditions.

What is claimed is:

1. The process of developing an image-wise exposed photoresist-coated substrate comprising:

(1) coating said substrate with a light-sensitive composition useful as a positive working photoresist, said composition comprising an admixture of o-quinonediazide compound and a binder phenolic novolak resin comprising the product of a condensation reaction of an aldehyde comprising a haloacetaldehyde source or a mixture of an haloacetaldehyde source and a formaldehyde source with a phenolic monomer comprising at least one compound of the formula:

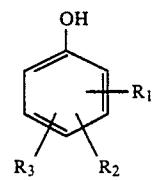

wherein R$_1$, R$_2$ and R$_3$ are individually selected from hydrogen or a one to four carbon alkyl group and wherein the ratio of total carbon atoms in the sum of R$_1$, R$_2$ and R$_3$ to the total number of phenolic nuclei in said resin is from about 0.5:1 to about 1.5:1 in the presence of a solvent; said resin made by employing a molar ratio of total aldehyde to total phenolic monomers from about 0.33:1 to about 0.70:1, the amount of said o-quinonediazide compound or compounds being about 5% to about 40% by weight and the amount of said binder resin being about 60% to 95% by weight, based on the total nonvolatile solids content of said light-sensitive composition;

(2) subjecting said coating on said substrate to an image-wise exposure of radiation; and (3) subjecting said image-wise exposed coated substrate to a developing solution wherein the exposed areas of said light-exposed coating are dissolved and removed from the substrate, thereby resulting in positive image-wise pattern in the coating.

2. The process of claim 1 wherein said radiant light energy is ultraviolet light.

3. The process of claim 1 wherein said developing solution comprises an aqueous solution of an alkali metal hydroxide or silicates or an aqueous solution of tetramethylammonium hydroxide.

* * * * *